US006593175B2

(12) United States Patent
Feudel et al.

(10) Patent No.: US 6,593,175 B2
(45) Date of Patent: Jul. 15, 2003

(54) METHOD OF CONTROLLING A SHAPE OF AN OXIDE LAYER FORMED ON A SUBSTRATE

(75) Inventors: Thomas Feudel, Radebeul (DE); Manfred Horstmann, Dresden (DE); Christian Krüger, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/809,710

(22) Filed: Mar. 14, 2001

(65) Prior Publication Data

US 2002/0048970 A1 Apr. 25, 2002

(30) Foreign Application Priority Data

Oct. 24, 2000 (DE) .......................................... 100 52 680

(51) Int. Cl.[7] .......................... H01L 21/00; H01L 21/84
(52) U.S. Cl. ...................... 438/152; 438/152; 438/787; 438/778; 438/585
(58) Field of Search .................. 438/152, 787, 438/778, 585

(56) References Cited

U.S. PATENT DOCUMENTS

| | | | | |
|---|---|---|---|---|
| 5,198,373 A | * | 3/1993 | Yoshino | 437/31 |
| 5,252,501 A | * | 10/1993 | Moslehi | 437/34 |
| 5,315,144 A | * | 5/1994 | Cherne | 257/351 |
| 5,545,580 A | * | 8/1996 | Sheng et al. | 437/48 |
| 5,654,217 A | * | 8/1997 | Yuan et al. | 438/588 |
| 5,882,993 A | | 3/1999 | Gardner et al. | 438/591 |
| 6,180,969 B1 | * | 1/2001 | Yang et al. | 257/291 |
| 6,316,330 B1 | * | 11/2001 | Yang et al. | 438/424 |
| 6,368,921 B1 | * | 4/2002 | Hijzen et al. | 438/270 |
| 2001/0005035 A1 | * | 6/2001 | Kinoshita | 257/568 |

OTHER PUBLICATIONS

Karulkar et al. "Characterization of simox and zmr materials by spreading resistance and point contact current voltage techniques" SOS/SOI technology Conference 1989 IEEE. p. 97–98.*

* cited by examiner

*Primary Examiner*—Matthew Smith
*Assistant Examiner*—Granvill D Lee, Jr.
(74) *Attorney, Agent, or Firm*—Williams, Morgan & Amerson, P.C.

(57) ABSTRACT

A method of forming an oxide layer on a substrate comprises deposition of a mask layer with an opening for defining the area where the oxide layer is to be formed, and an ion implantation step performed with a tilt angle so as to obtain a varying ion concentration. In a subsequent single oxidation step, an oxide layer is formed having a thickness that varies in conformity with the ion concentration. This method may advantageously be applied to the formation of a gate insulation layer in a field effect transistor.

26 Claims, 2 Drawing Sheets

METHOD OF CONTROLLING A SHAPE OF AN OXIDE LAYER FORMED ON A SUBSTRATE

BACKGROUND OF THE INVENTION

1. Field of the Invention

The present invention relates to the field of semiconductor production in integrated circuits, and, more particularly, to the formation of gate insulation layers of transistor devices.

2. Description of the Related Art

The manufacturing process of integrated circuits (ICs) involves the fabrication of numerous semiconductor devices, such as field effect transistors, on a single substrate. In order to provide increased integration density and improved device performance, for instance with respect to signal processing time and power consumption, feature sizes of the semiconductor devices are steadily decreasing. In general, decreasing feature sizes of a field effect transistor provide a variety of advantages, such as high package density and small rise and fall times during switching of the transistors, due to, for example, a reduced channel length. On the other hand, steadily reducing the feature sizes of field effect transistors may lead to certain disadvantages that may significantly deteriorate the signal performance of the devices.

One of the problems involved in reducing feature sizes in a transistor is an increased gate leakage current of the final transistor device. As is well known, in a typical MOS device, a drain region and a source region are separated by a channel region, the conductivity of which is controlled by a voltage applied to a gate electrode that is formed above the channel region and electrically isolated therefrom by a thin gate insulation layer, e.g., a thin layer of silicon dioxide. Since the thickness of the insulation layer as well as the length of the channel has steadily been reduced, whereas the external voltages applied to the gate, drain and source regions have substantially been maintained, a relatively strong electric field acts on the charge carriers in the channel, drain and source regions. The large electric field may allow a charge carrier to gather sufficient energy to penetrate the gate insulation layer, or even to reach the gate electrode. In the latter case, a parasitic gate current is generated, while in the former case accumulation of charge carriers may occur, significantly affecting the characteristics of the device, which may result in an increase of the gate threshold voltage. Both effects may considerably reduce the switching speed of the transistor and may, furthermore, lead to a degraded long-term stability and a reduced reliability of the device. Although lightly doped drain and source regions are formed in an MOS transistor adjacent to the gate insulation layer for reducing the peak electric field, further measures are typically taken in an effort to weaken the effects described above. In a typical MOS process, a further oxidation step during the formation of a gate insulation layer comprised of silicon dioxide is commonly carried out to increase the thickness of the gate insulation layer at the edges adjacent to the source and drain regions, respectively.

To clearly demonstrate the problems involved with the formation of a gate oxide layer in a typical MOS transistor device, a typical prior art process flow will be described with reference to FIGS. 1(a) to 1(c). As the skilled person will readily appreciate, the figures depicting the prior art process flow are merely of schematic nature and transitions and boundaries illustrated as sharp lines may not be imparted as sharp transitions in a real device. Furthermore, the description of the typical prior art process refers to standard manufacturing procedures without specifying typical process parameter values used for these procedures, since individual processing steps may be accordingly adapted to meet specific design requirements. Moreover, only the relevant portions are illustrated and described.

FIG. 1(a) shows a schematic cross-sectional view of a portion of a typical MOS transistor device at a specific manufacturing stage. Over a semiconductor substrate 101 a gate electrode 102 in an initial manufacturing stage is formed and electrically isolated from the substrate 101 by a gate insulation layer 103 comprised of silicon dioxide. The process for forming the structure shown in FIG. 1(a) is well known. First, a layer of silicon dioxide is thermally grown on the substrate 101, and thereafter a layer of gate electrode material, such as polysilicon, is deposited on the silicon dioxide layer. Next, the polysilicon layer is patterned by photolithography and etching to form the gate electrode 102 depicted in FIG. 1(a).

FIG. 1(b) shows a schematic cross-sectional view of the device depicted in FIG. 1(a) wherein edges 104 of the gate oxide layer 103 have an increased thickness. FIG. 1(c) schematically shows a cross-sectional view of the device of FIG. 1(b) with a drain region 105 and a source region 106 formed in the substrate 101. As can be seen from the figures, the gate insulation layer 103 comprises the edges 104 adjacent to the drain region 105 and the source region 106, respectively, that extend with a substantially uniform thickness distribution along a transistor width dimension, which is the direction normal to the drawing plane of FIGS. 1(a) to 1(c). The increased thickness of the edges 104, in combination with the lightly doped portions of the drain region and the source region adjacent to the gate insulation layer 103, result in a reduced effective electric field. Accordingly, charge carrier accumulation and/or gate leakage currents are reduced. The formation of the edges 104 with an increased thickness requires, however, an additional oxidation step that leads to an additional high temperature treatment, thereby creating additional thermal stress in the substrate. Moreover, it is very difficult to control the shape of the insulation layer 103, i.e., the thickness distribution of the insulation layer 103, so that the final shape of the oxide layer is only adjustable within a small thickness range.

In view of the above, there exists a need for an improved method of forming a gate insulation layer on a semiconductor surface wherein the thickness distribution is adaptable to specific design requirements. Moreover, a need exists for an improved method of forming a gate insulation layer of an MOS transistor as well as for an MOS transistor device having an improved gate insulation layer.

SUMMARY OF THE INVENTION

According to one aspect of the present invention, a method of forming an oxide layer on a semiconductor layer comprises providing a substrate with the semiconductor layer, the semiconductor layer having a surface, depositing a mask layer with a predefined thickness over the semiconductor layer, forming an opening in the mask layer by patterning the mask layer so as to expose a portion of the surface of the semiconductor layer, the portion substantially coinciding with an area where the oxide layer is to be formed, performing an ion implantation step with a tilt angle with respect to a direction perpendicular to the exposed portion, thereby using the mask layer as an implantation mask so as to create an inhomogeneous or non-uniform ion concentration in the area of the exposed portion, and oxidizing the substrate to form the oxide layer, wherein a thickness of the oxide layer in a region of increased ion concentration is reduced due to a reduced oxidation rate.

According to the first aspect of the present invention, an oxide layer can be formed on a semiconductor layer, such as silicon, by a single oxidation step, wherein the thickness distribution of the oxide layer may be varied in conformity with design requirements. The oxidation rate significantly depends on the ion concentration deposited in and on the semiconductor layer. Thus, by controlling the ion concentration within the exposed portion of the semiconductor layer, the final thickness of the final oxide layer is determined by the distribution of the ions during the implantation step. Since the ions are directed in a substantially parallel manner at a selected tilt angle with respect to the surface, the ion concentration may easily be controlled by appropriately choosing the predefined thickness and/or the tilt angle.

According to further variations of the present invention, the tilt angle may be varied during the implantation step by, for example, rotating the substrate and/or two or more implantation steps may subsequently be performed, wherein the tilt angle is changed in each implantation step so as to obtain the ion concentration required for forming the oxide layer in conformity with specific design rules.

According to another aspect of the present invention, a method of forming a gate electrode in a field effect transistor comprises providing a substrate including a semiconductor region having a surface, depositing a mask layer with a predefined thickness over the semiconductor region and forming an opening with a length dimension and a width dimension in the mask layer to expose an area of the semiconductor region in which the gate electrode is to be formed. The method further comprises performing an ion implantation step to create an ion concentration that varies along the length dimension but is substantially uniform along the width dimension, oxidizing the exposed area to generate an oxide layer with a thickness depending on the ion concentration, depositing a layer of gate electrode material over the substrate to fill the opening, polishing the layer of gate electrode material to planarize a surface of the filled opening and removing the mask layer to form the gate electrode having the gate oxide layer with a thickness that varies in accordance with the ion concentration.

Contrary to the prior art process flow, the present invention allows to form a gate oxide layer in a single oxidation step, wherein the thickness of the oxide layer along the transistor length dimension can be adjusted to be in conformity with design requirements, since the implantation step involved can be well controlled.

Moreover, according to the present invention the thickness of the gate oxide layer may be adjusted so that the edges of the oxide layer extending along the transistor width dimension exhibit a thickness that is optimized for operation parameters of the final transistor, for example a specified maximum gate voltage and maximum drain source voltage of the transistor during operation.

According to still another aspect of the present invention, a field effect transistor formed on a substrate comprises: a drain region and a source region, formed in an active region, spaced apart from each other in a transistor length dimension and extending along a transistor width dimension in a substantially parallel manner, and a gate electrode formed over the active region and electrically insulated therefrom by a gate insulation layer, the gate insulation layer comprising an oxide having a thickness that varies along the transistor length dimension, but is substantially uniform along the transistor width dimension, wherein the thickness of the gate insulation layer adjacent to the source region is less than the thickness adjacent to the drain region.

The field effect transistor formed in accordance with the present invention comprises a gate insulation layer having an oxide portion the thickness of which is less at the source region than at the drain region. Since generally a thin gate insulation layer is desirable for improving performance of the transistor device, increasing the thickness of the gate insulation layer is preferably carried out at those locations where the highest electric field prevails so as to reduce charge carrier accumulation and parasitic gate leakage currents as previously explained. Accordingly, the present invention provides a field effect transistor comprising an asymmetric gate insulation layer thickness that insures optimal signal performance due to the gate insulation layer's increased portion of small thickness compared to a symmetric prior art device while simultaneously significantly reducing charge carrier accumulation and parasitic gate leakage currents.

BRIEF DESCRIPTION OF THE DRAWINGS

The invention may be understood by reference to the following description taken in conjunction with the accompanying drawings, in which like reference numerals identify like elements, and in which.

Figure 1A:
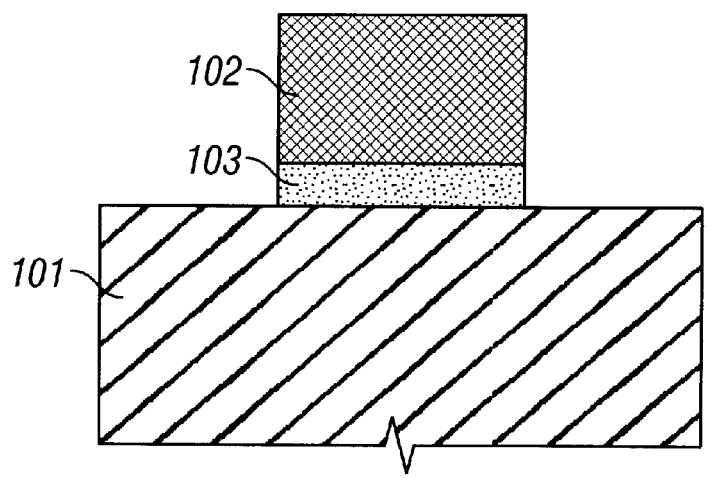
FIGS. 1(a) to 1(c) schematically show a cross-section of a typical prior art process flow for forming a gate electrode with a field effect transistor.
Figure 1B:
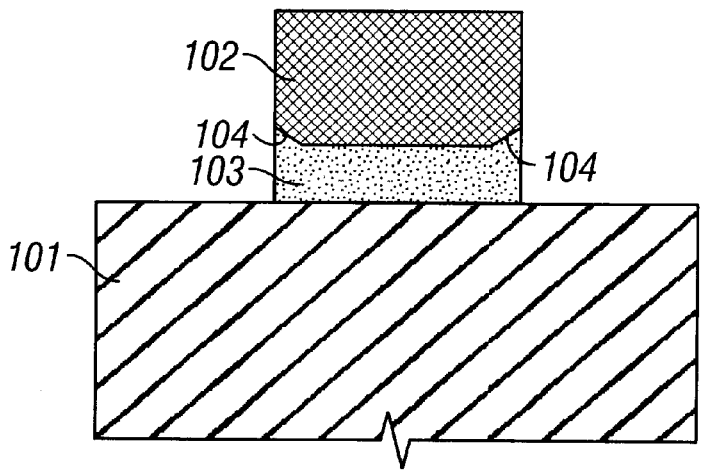
Figure 1C:
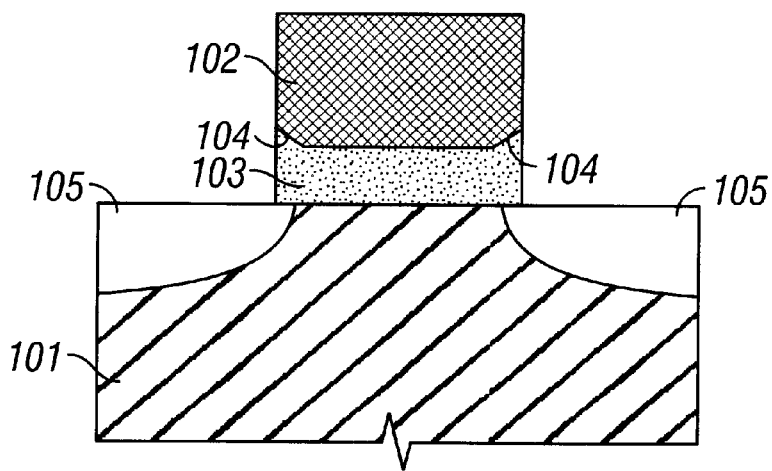

While the present invention is described with reference to the embodiment as illustrated in the following detailed description as well as in the drawings, it should be understood that the following detailed description as well as the drawings are not intended to limit the present invention to the particular embodiment disclosed, but rather the described embodiment merely exemplifies the various aspects of the present invention, the scope of which is defined by the appended claims.

DETAILED DESCRIPTION OF THE INVENTION

Further advantages and objects of the present invention will become more apparent with the following detailed description and the appended claims. Furthermore, it is to be noted that although the present invention is described with reference to the embodiments as illustrated in the following detailed description, it should be noted that the following detailed description is not intended to limit the present invention to the particular embodiments disclosed, but rather the described embodiment merely exemplifies the various aspects of the present invention, the scope of which is defined by the appended claims.

Figure 2A:
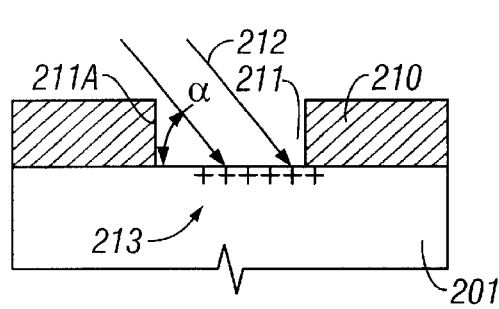
FIGS. 2(a) to 2(d) schematically show cross-sectional views of a process flow for forming a gate electrode having an asymmetric gate insulation layer according to one embodiment of the present invention.

FIG. 2(a) schematically shows a cross-sectional view of a field effect transistor in an initial manufacturing stage. According to FIG. 2(a), on a substrate 201, such as a silicon substrate or an insulating substrate having formed thereon a semiconductor layer, a mask layer 210, having an opening 211, is formed. The mask layer 210 may be comprised of silicon nitride, or other like materials, and may be deposited by chemical vapor deposition (CVD) with a predefined thickness. Subsequently, the opening 211 is formed by photolithography and etching to define an area over the substrate 201 in which a gate electrode is to be formed. After formation of the opening 211, an ion implantation step is performed, for example, using nitrogen ions, wherein the ions are directed to the exposed area of the substrate 201 in a substantially parallel manner at an angle of incidence $\alpha$ with respect to the surface of the exposed area. The incident ions are indicated by arrow 212 in FIG. 2($a$). Depending on the tilt angle $\alpha$ and/or the thickness of the mask layer 210, a region 213 is formed in and on the substrate 201 adjacent a sidewall 211A, and it is substantially absent of implanted ions, or at least it has a drastically reduced ion concentration. That is, in the exposed area of the substrate 201, an area having an inhomogeneous, or non-uniform, concentration of implanted ions is formed. For example, in the specific embodiment disclosed in FIG. 2($a$), the concentration of the implanted ions in the exposed portion of the substrate 201 would range from a relatively small value (perhaps even zero) in the substrate adjacent the wall 211A to a higher concentration (perhaps a maximum) in the substrate adjacent the wall 211B. In this manner, the implanted ion concentration in the exposed portion of the substrate varies along the length direction, i.e., from wall 211A to wall 211B.

It is to be noted that FIG. 2($a$), as well as the Figures following, show a cross-sectional view of a field effect transistor to be formed in a transistor length dimension. Accordingly, the ion concentration varies in the transistor length dimension. Preferably, in forming a gate insulation layer for the gate electrode, the ion concentration in the transistor width dimension, which extends perpendicular to the drawing plane of FIG. 2($a$), is substantially uniform so as to obtain a final cross-sectional shape of the gate insulation layer that meets the requirements for low charge-carrier accumulation and low gate-leakage currents, as previously explained. It should be noted, however, that any required ion concentration can be accomplished by varying the tilt angle during the ion implantation step. This can be achieved by, for example, appropriately rotating the substrate during the implantation procedure, and/or performing one or more subsequent implantation steps with different tilt angles.

FIG. 2($b$) schematically shows a cross-sectional view of the device of FIG. 2($a$) with a gate insulation layer 203 comprised of silicon dioxide formed at the bottom of the opening 211. The insulation layer 203 comprises an edge region 204 having an increased thickness. The silicon dioxide gate insulation layer 203 is formed by a thermal growth process, wherein due to the varying ion concentration, in this case due to the varying nitrogen ion concentration, the oxidation rate is enhanced in the region 213 of reduced ion concentration. The reason for the decreased oxidation rate in the area of high nitrogen concentration resides in the fact that on and near the surface of the substrate 201 comprising the high ion concentration, the number of reaction partners in the oxidation process is significantly reduced so that the production rate of the gate insulation layer material, for instance silicon dioxide, is remarkably slowed down compared with the region 213, with a low, or substantially no, ion concentration.

In a further illustrative embodiment, the implantation energy of the ions is selected so as to obtain the highest ion concentration in a depth that is in the vicinity of the surface of the substrate 201 within the opening 211. Moreover, the amount of ion concentration can be controlled by adjusting the time and/or the dose of the implantation process.

FIG. 2($c$) schematically shows the device of FIG. 2($b$), wherein the opening 211 is filled with a gate electrode material to form the gate electrode 202. The gate electrode 202 is formed by depositing the gate electrode material over the opening 211 and the mask layer 210, and polishing the resulting structure until a planar surface is obtained with a final thickness of the mask layer 210 that is in conformity with design requirements, i.e., that is in conformity with the required height of the gate electrode 202.

FIG. 2($d$) schematically shows a cross-sectional view of the final transistor device with a drain region 205 and a source region 206 formed in the substrate 201. As can be seen, the region 204 of increased silicon dioxide thickness is located adjacent to the drain region 205, whereas the thickness of the residual gate insulation layer 203 exhibits the required small thickness so as to provide for excellent signal performance of the transistor device.

In a typical example, the thickness of the gate insulation layer is 1.5 nm and the thickness is increased by 0.1 nm over a distance of 5 nm. Such a thickness profile may be obtained by means of an ion implantation with an energy of about 10 keV, an implantation dose of $10^{14}$ cm$^{-2}$ and a tilt angle of 45°. The parasitic gate leakage current is thereby reduced by about one order of magnitude compared to a conventionally manufactured device.

According to the asymmetric cross-sectional shape of the gate insulation layer 203, charge carrier transportation into the gate insulation layer 203 caused by the electric field increasing from source to drain is efficiently reduced to the increased thickness of the gate insulation layer at the location of the maximum electric field. Accordingly, a highly reliable transistor device is formed wherein signal performance is improved compared to prior art devices.

Moreover, in contrast to the typical prior art process flow, the present invention allows the formation of a region of increased oxide thickness by means of a single oxidation step so that any thermal stress occurring during the high temperature treatment is minimized. Furthermore, the degree of the oxidation rate during the oxidation process can be precisely controlled by the parameters of the implantation step, i.e., implantation energy and dose, and by the easily-controlled thickness of the mask layer as well as by adjusting the tilt angle. Hence, the resulting thickness of the gate insulation layer may be precisely controlled within a large thickness range, and thus precisely adapted to specific performance conditions of the transistor device, such as maximum drain source voltage and the like.

Furthermore, the above process flow for forming a gate insulation layer having a varying thickness is illustrated with reference to a gate insulation layer of a field effect transistor. The present invention is also applicable to any process flow requiring the formation of an oxide layer with a varying thickness. Particularly, although described with reference to a silicon substrate, the present invention may be applied to any other semiconductor substrate, such as germanium, III–V semiconductors, and II–VI semiconductors, and substrates having a semiconductor layer formed thereon.

With reference to FIGS. 3($a$) to 3($d$), a further embodiment of the present invention will be explained. FIG. 3($a$) schematically shows a cross-sectional view of a semiconductor device in an initial manufacturing stage. In this and the following figures, features that are similar to those shown in FIGS. 2($a$) to 2($d$) are indicated by identical reference numbers. In FIG. 3($a$) the mask layer 210, for example comprised of silicon nitride, is formed over the substrate 210, which may be a silicon substrate. The opening 211 in the mask layer 210 exposes a portion of the surface of the substrate 201. As indicated by the arrows 212, an ion implantation step is performed employing two tilt angles α and β so as to produce regions 213 of decreased ion concentration at the edges of the opening 211 with a central portion of a relatively higher concentration as depicted by the varying density of the "+" marks in the figure.

Figure 3A:
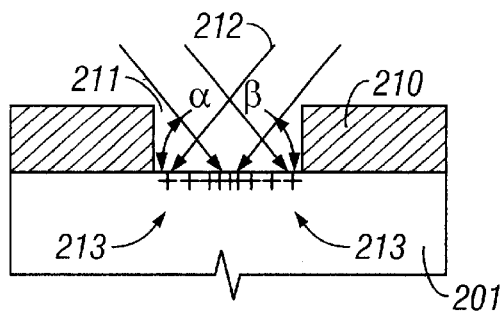
FIGS. 3(a) to 3(d) schematically show cross-sectional views of a process flow for forming a gate electrode of a field effect transistor with a symmetric gate insulation layer according to a further embodiment of the present invention.
Figure 2B:
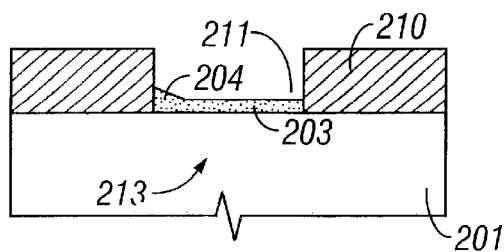
Figure 3B:
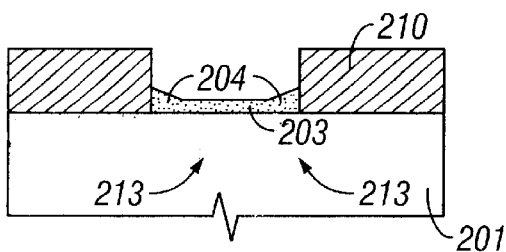
Figure 2C:
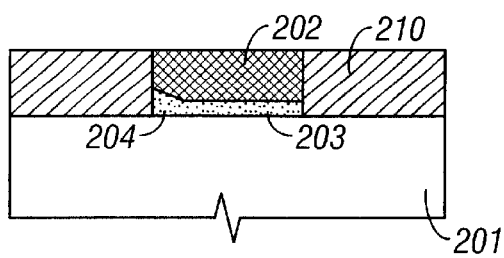

FIG. 3(b) schematically shows the device of FIG. 3(a) after an oxidation step has been performed. A gate insulation layer 203 comprised of silicon dioxide is formed on the surface of the substrate 201 within the opening 211. Over the areas of decreased ion concentration 213, portions 204 are formed that exhibit a larger thickness than the residual portion of the gate insulation layer 203. As previously mentioned, the portions 204 of increased thickness are formed since the oxidation rate depends on the ion concentration, and the regions 213 of relatively low ion concentration result in a relatively thicker layer of silicon dioxide. Regarding the control of the oxidation process and final thickness variation of the gate insulation layer 203, analogous criteria as given with reference to FIGS. 2(a)–2(d) apply in this case as well.

Figure 3C:
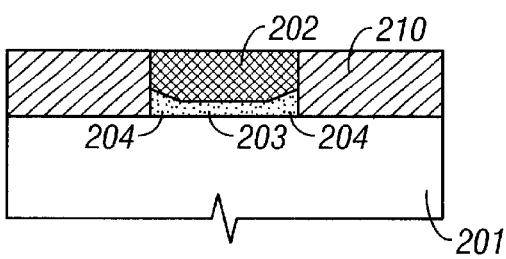
Figure 2D:
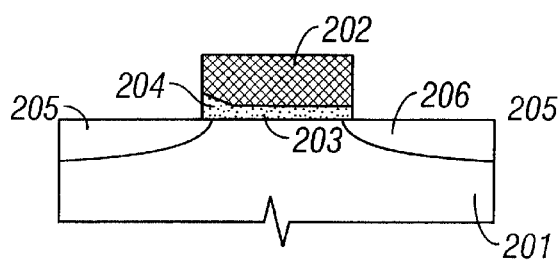
Figure 3D:
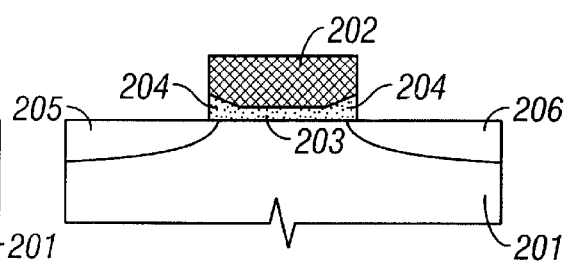

FIG. 3(c) shows the device of FIG. 3(b) with the opening 211 filled with a gate electrode material. FIG. 3(d) depicts the final transistor device after the mask layer 210 has been selectively removed and the source region 206 and the drain region 205 have been formed. The gate electrode 202 comprises a gate insulation layer 203 having portions 204 of increased thickness adjacent to the drain region and the source region, respectively. This arrangement is advantageous for transistor devices in integrated circuits in which the transistors are used in a symmetrical manner, i.e., in configurations where it is not defined in advance which of the drain and source regions actually serve as the drain and the source. However, as previously stated, the gate insulation layer 203 formed in accordance with the present invention is created in a single oxidation step, avoiding additional thermal stress in the substrate, wherein the cross-sectional shape can be precisely controlled within a wide thickness range.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming an oxide layer on a semiconductor layer, comprising:
   providing a substrate with the semiconductor layer, the semiconductor layer having a surface;
   depositing a mask layer with a predefined thickness over the semiconductor layer;
   forming an opening in the mask layer by patterning the mask layer so as to expose a portion of the surface of the semiconductor layer, the portion substantially coinciding with an area where the oxide layer is to be formed;
   performing an ion implantation step with a tilt angle with respect to the surface of the exposed portion of the substrate, thereby using the mask layer as an implantation mask so as to create an inhomogeneous ion concentration in the area of the exposed portion; and
   oxidizing the exposed portion of the substrate to form the oxide layer, wherein a thickness of the oxide layer in a region of increased ion concentration is reduced due to a reduced oxidation rate.

2. The method of claim 1, wherein an implantation energy of the ion implantation is adjusted to obtain a maximum ion concentration in a depth near the surface interface of the exposed portion.

3. The method of claim 1, wherein substantially nitrogen ion are implanted.

4. The method of claim 1, wherein said semiconductor layer comprises silicon.

5. The method of claim 1, wherein the area of increased ion concentration is selected by adjusting the predefined thickness of the mask layer.

6. The method of claim 1, wherein the area of increased ion concentration is selected by adjusting the tilt angle of the ion implantation.

7. The method of claim 6, wherein adjusting the tilt angle is performed by rotating the substrate during ion implantation to obtain a varying ion concentration.

8. The method of claim 6, wherein two or more implantation steps are performed using at least two different tilt angles.

9. A method of forming a gate electrode in a field effect transistor, the method comprising:
   providing a substrate including a semiconductor region having a surface;
   depositing a mask layer with a predefined thickness over the semiconductor region;
   forming an opening with a length dimension and a width dimension in the mask layer to expose an area of the semiconductor region in which the gate electrode is to be formed;
   performing an ion implantation step to create an ion concentration that varies along the length dimension;
   oxidizing the exposed area to generate an oxide layer with a thickness depending on the ion concentration;
   depositing a layer of gate electrode material over the substrate to fill the opening;
   polishing the layer of gate electrode material to planarize a surface of the filled opening; and
   removing the mask layer to form the gate electrode having the gate oxide layer with a thickness that varies in accordance with the ion concentration.

10. The method of claim 9, wherein the varying ion concentration is controlled by selection of the tilt angle in the ion implantation step.

11. The method of claim 10, wherein the tilt angle with respect to the surface of the semiconductor region is less than 45°.

12. The method of claim 9, wherein the varying ion concentration is controlled by adjusting the predefined thickness of the mask layer, whereby the predefined thickness is equal to or more than a height of the gate electrode to be formed.

13. The method of claim 9, wherein the predefined concentration along the length dimension of one edge of said area is adjusted to be higher than the concentration of the other edge.

14. The method of claim 13, wherein said one edge is adjacent to the region where a drain region of the field effect transistor is to be formed.

15. The method of claim 9, wherein nitrogen ions are implanted.

16. A method of forming a gate electrode in a field effect transistor, the method comprising:

provyding a substrate including a semiconductor region having a surface;

depositing a mask layer with a predefined thickness over the semiconductor region;

forming an opening with a length dimension and a width dimension in the mask layer to expose an area of the semiconductor region in which the gate electrode is to be formed;

performing at least two ion implantation steps with different tilt angles to create a continuously varying ion concentration that varies along the length dimension so as to obtain an ion concentration along the length dimension that is higher in a central portion of the area than at the edges of the area;

oxidizing the exposed area to generate an oxide layer with a thickness depending on the ion concentration;

depositing a layer of gate electrode material over the substrate to fill the opening;

polishing the layer of gate electrode material to planarize a surface of the filled opening; and removing the mask layer to form the gate electrode having the gate oxide layer with a thickness that varies in accordance with the ion concentration.

17. A method of forming a gate electrode in a field effect transistor, the method comprising:

providing a substrate including a semiconductor region having a surface;

depositing a mask layer with a predefined thickness over the semiconductor region;

forming an opening with a length dimension and a width dimension in the mask layer to expose an area of the semiconductor region in which the gate electrode is to be formed;

performing an ion implantation step, wherein a tilt angle of said ion implantation step is continuously varied by rotating said substrate so as to create a continuously varying ion concentration that varies along the length dimension;

oxidizing the exposed area to generate an oxide layer with a thickness depending on the ion concentration;

depositing a layer of gate electrode material over the substrate to fill the opening;

polishing the layer of gate electrode material to planarize a surface of the filled opening; and removing the mask layer to form the gate electrode having the gate oxide layer with a thickness that varies in accordance with the ion concentration.

18. A method of forming an oxide layer on a substrate, the method comprising:

providing a substrate including a semiconductor region having a surface;

depositing a mask layer over the semiconductor region;

forming an opening with a first dimension and a second dimension in the mask layer to expose an area of the semiconductor region in which the oxide layer is to be formed;

performing at least one angled ion implantation step to implant ions into said substrate such that the ion concentration in said substrate varies along said first dimension; and oxidizing the exposed area to generate said oxide layer with a thickness depending on the ion concentration.

19. The method of claim 18, wherein the varying ion concentration is controlled by selection of a tilt angle of the at least one angled ion implantation step.

20. The method of claim 18, wherein the varying ion concentration is controlled by adjusting a thickness of the mask layer.

21. The method of claim 18, wherein the concentration along the first dimension of one edge of said area is adjusted to be higher than the concentration of the other edge.

22. The method of claim 21, wherein said one edge is adjacent to the region where a drain region of a field effect transistor is to be formed.

23. The method of claim 18, wherein performing at least one angled ion implantation step comprises performing at least two implantation steps with different tilt angles so as to obtain an ion concentration along the first dimension that is higher in a central portion of area than at the edges of the area.

24. The method of claim 18, wherein said at least one angled ion implantation process is performed at a tilt angle with respect to the surface of the semiconductor region that is than 45°.

25. The method of claim 18, wherein a tilt angle of said at least one angled ion implantation process is continuously varied by rotating the substrate so as to create a continuously varying ion concentration in the first dimension.

26. The method of claim 18, wherein nitrogen ions are implanted during said at least one angled ion implantation process.

* * * * *